(12) United States Patent
Oishi et al.

(10) Patent No.: US 6,317,476 B1
(45) Date of Patent: Nov. 13, 2001

(54) SUPPRESSING CHANNEL-DEPENDENT SPURIOUS SIGNALS IN FRACTIONAL-N SYNTHESIZER

(75) Inventors: Kazuaki Oishi; Kimitoshi Niratsuka, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/143,654

(22) Filed: Aug. 31, 1998

(30) Foreign Application Priority Data

Feb. 5, 1998 (JP) .................................................. 10-024465

(51) Int. Cl.[7] .................................................. H04L 25/36
(52) U.S. Cl. ........................ 375/371; 375/374; 375/376; 327/157; 331/15
(58) Field of Search .................................. 375/371, 373, 375/374, 375, 376; 327/155, 156, 157; 331/15, 17, 25, 27; 332/127

(56) References Cited

U.S. PATENT DOCUMENTS

| | | | | |
|---|---|---|---|---|
| 5,180,993 | * | 1/1993 | Dent ......................................... | 331/16 |
| 5,818,303 | * | 10/1998 | Oishi et al. ............................. | 331/1 A |
| 5,834,987 | * | 11/1998 | Dent ...................................... | 332/127 |
| 5,847,611 | * | 10/2000 | Hirata ..................................... | 331/1 A |
| 5,982,405 | * | 4/1999 | Kamikubo et al. ................... | 331/1 A |
| 6,130,561 | * | 10/2000 | Defour ................................... | 327/105 |
| 6,130,925 | * | 10/2000 | Ichimaru et al. ...................... | 375/376 |
| 6,141,394 | * | 10/2000 | Linebarger et al. .................. | 375/376 |

* cited by examiner

*Primary Examiner*—Stephen Chin
*Assistant Examiner*—Dac V. Ha
(74) *Attorney, Agent, or Firm*—Armstrong, Westerman, Hattori, McLeland & Naughton, LLP

(57) ABSTRACT

A device for suppressing spurious signals generated by a fractional-N synthesizer. The fractional-N synthesizer generates an output frequency where an underlying PLL circuit uses a frequency divider for dividing the output frequency by a frequency-division ratio to obtain a comparison frequency and performs phase-comparison operations between a reference frequency and the comparison frequency to control the output frequency. The output frequency is changed by a frequency interval smaller than the reference frequency by making a temporal change to the frequency-division ratio once in every predetermined number of cycles. The device for suppressing spurious signals includes a current-generation unit which generates an electrical current proportional to a value representing an ordinal position of a current cycle in the every predetermined number of cycles, and a current-summation unit which adds the electrical current to another electric current controlling the output frequency in synchronism with the phase-comparison operations for a duration proportional to a cycle of the output frequency.

12 Claims, 16 Drawing Sheets

FIG. 8A  P1
FIG. 8B  P2
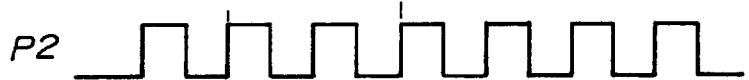
FIG. 8C  P3
FIG. 8D  P4
$tad = 1/fp' \propto 1/fo$ FIG.11A  REFERENCE FREQUENCY fr
FIG.11B  COMPARISON FREQUENCY fp
FIG.11C  OVERFLOW SIGNAL Sov
FIG.11D  CHARGE-PUMP-OUTPUT CURRENT Icp
FIG.11E  SPURIOUS-SUPPRESSING-CIRCUIT OUTPUT CURRENT Iss
FIG.11F  LOOP-FILTER-INPUT CURRENT Do (Do = Icp + Iss)

SUPPRESSING CHANNEL-DEPENDENT SPURIOUS SIGNALS IN FRACTIONAL-N SYNTHESIZER

BACKGROUND OF THE INVENTION

The present invention relates to spurious signal suppressing devices, spurious suppressing methods, and fractional-N synthesizers, and particularly relates to a method of and a device for suppressing spurious signals in frequency spectrum output from a fractional-N synthesizer. Further, the present invention relates to a fractional-N synthesizer equipped with a function to suppress such spurious signals.

Recent development of mobile-communication technology and semiconductor manufacturing technology has generated a rapid increase in wide-spread use of personal-handy phones, cordless phones, and the like not only in advanced nations but also in developing countries as well. Technologies required in such mobile-communication field include a PLL-frequency synthesizer.

The PLL-frequency synthesizer has a PLL (phase-locked loop) circuit therein, and controls an oscillator, one of the elements of the PLL circuit, to generate signals of various frequencies. The PLL-frequency synthesizer receives a signal derived from an output of a quartz generator as a reference signal, and changes a frequency of an output signal by a frequency interval equivalent to the cycle of the reference signal.

As the number of mobile, wireless terminals increases rapidly, the number of available channels also needs to be increased in proportion. A frequency space to which channels are allocated, however, is a limited resource, and available frequency bands are allocated on industry-by-industry bases as each industry requires a certain range of frequency space for wireless communication. Against this background, the PLL-frequency synthesizer is required to switch the frequency of an output thereof by a smaller frequency interval with an aim of securing a larger number of channels.

To meet this demand, a fractional-N-frequency synthesizer (or fractional-N synthesizer) has been proposed. In the following, a PLL-frequency synthesizer will be described first with regard to a configuration thereof. Then, a fractional-N-frequency synthesizer of the related art will be explained based on the understanding of the PLL-frequency synthesizer.

FIG. 1 is a block diagram of a PLL-frequency synthesizer generally used in the related art.

As shown in FIG. 1, the PLL-frequency synthesizer includes a phase comparator 1, a charge-pump circuit 2, a loop filter 3, a voltage-control oscillator 4, and a frequency divider 5. The phase comparator 1 detects a phase difference between a signal having a reference frequency fr and a signal having a comparison frequency fp, and outputs a voltage pulse to the charge-pump circuit 2 such that the voltage pulse has a pulse width dependent on the detected phase difference. The charge-pump circuit 2 generates a charge-pump-output current Icp, which has one of the three states, i.e., a flowing-out state, a flowing-in state, and a high-impedance state.

The charge-pump-output current Icp from the charge-pump circuit 2 is smoothed by the loop filter 3, and is converted into a voltage signal which is output from the loop filter 3. The voltage signal output from the loop filter 3 is supplied to the voltage-control oscillator 4 as a control voltage, so that the voltage-control oscillator 4 generates a signal having a frequency fo depending on the control voltage. The signal having the frequency fo is subjected to N frequency division by the frequency divider 5, and is fed back to the phase comparator 1 as the comparison frequency fp. Here, the reference frequency fr may be generated when a frequency fosc output from a quartz oscillator (not shown) is divided by a frequency divider 6.

The PLL-frequency synthesizer as described above controls the reference frequency fp such that the comparison frequency fp and the reference frequency fr have the same frequency and the same phase. Further, fp is represented as fo/N due to the frequency division by the frequency divider 5. Thus, there is a relation, $$fo = N \times fr \qquad (1)$$

The equation (1) means that a step change in the frequency division ratio N entails a step change in fo by a frequency interval equal to the frequency fr. Namely, the PLL-frequency synthesizer is capable of generating various frequencies when only one frequency is supplied from the quartz oscillator.

FIG. 2 is a block diagram of a fractional-N-frequency synthesizer.

As can be seen from the figure, the fractional-N-frequency synthesizer (or fractional-N synthesizer) includes an accumulator 7 and a spurious suppressing circuit 8 newly provided in addition to the configuration of the PLL-frequency synthesizer shown in FIG. 1. The accumulator 7 receives the reference frequency fr from the frequency divider 6 as a clock frequency, and obtains a sum of an accumulated value acm and input data F at each phase-comparison cycle employed by the phase comparator 1. The accumulated value acm of the accumulator 7 is updated with an increment equal to F at each phase-comparison cycle in this manner. In the example of FIG. 2, the accumulator 7 uses the reference frequency fr as a clock frequency thereof. Alternately, the clock frequency maybe the comparison frequency fr or any other frequency signal as long as the frequency thereof corresponds to the phase-comparison cycles of the phase comparator 1.

If the accumulator 7 has an n-bit configuration, an overflow occurs when the accumulated value acm becomes $2^n$. When this happens, the accumulator 7 outputs an overflow signal Sov to the frequency divider 5. The frequency divider 5 changes the ratio of frequency division from N to N+1 F times in every $2^n$ phase-comparison cycles.

FIGS. 3A through 3C are timing charts showing relations between the reference frequency fr, the comparison frequency fp, and the overflow signal Sov. Here, the figures show a case where n=2 and F=1, and either the reference frequency fr or the comparison frequency fp represents the phase-comparison cycles of the phase comparator 1.

For the sake of explanation, the output frequency fo of the voltage-control oscillator 4 is represented as fo1 when the frequency-division ratio of the frequency divider 5 is N+1, and is denoted as fo2 when the frequency-division ratio is N. In view of the equation (1), the output frequency fo becomes either $$fo1 = (N+1) \times fr$$

or $$fo2 = N \times fr$$

wherein the former occurrence takes place F times in $2^n$ phase-comparison cycles, and the latter occurrence $(2^n-F)$ times. An average of fo can be represented as:

$$fo = (N+1) \times fr \times F/2^n + N \times fr \times (2^n - F)/2^n \quad (2)$$

$$= fr \times (N + F/2^n)$$

The equation (2) means that an average of the frequency fo output from the voltage-control oscillator 4 can be changed by a frequency interval smaller than the reference frequency fr when not only N but also F is changed.

A mere addition of the accumulator 7 to the PLL-frequency synthesizer is known to result in "spurious signals" being generated and included in the frequency spectrum of the output of the voltage-control oscillator 4. An average of the output frequency fo of the voltage-control oscillator 4 is represented by the equation (2) as described above. In effect, however, the output frequency fo exhibits periodic swings between fo1 $(=(N+1)\times fr)$ and fo2 $(=N\times fr)$. such swings generate spurious signals at positions apart from a center frequency by a distance of $k\times(fr/2^n)$ (k=1, 2, • • •) in the frequency spectrum of the output of the voltage-control oscillator 4.

In order to suppress spurious signals, the fractional-N-frequency synthesizer is provided with th spurious signals suppressing circuit 8. The spurious signal suppressing circuit 8 includes a D/A converter 9, which receives the accumulated value acm of the accumulator 7, and converts it to an electric-current signal so as to supply an output current Iad. The charge-pump-output current Icp from the charge-pump circuit 2 and the output current Iad from eh D/A converter 9 are added together to becomes a current Do, which is then supplied to the loop filter 3. Summation of the currents Icp and Iad serves to suppress the spurious signals.

FIGS. 3D through 3F are timing charts for explaining the principle of the spurious signal suppression. These figures show a case where the accumulator 7 has a 2-bit configuration (i.e., n=2), and the input data F is 1.

The accumulated value acm stored by the accumulator 7 is incremented by I (=F) at each phase-comparison cycle, and returns to zero when overflow is detected. The accumulated value acm, therefore, exhibits changes such as 0, 1, 2, 3, 0, 1, 2, 3, • • •. The accumulator 7 creases overflow once in every four phase-comparison cycles, so that the overflow signal Sov of the accumulator 7 shows changes thereof as shown in FIG. 3C. As a result, the frequency-division ratio of the frequency divider 5 changes from n to N+1 once in every four phase-comparison cycles. In the absence of the spurious signals suppressing circuit 8, the oscillator frequency swings between fo1 $(=(N+1)\times fr)$ and fo2 $(=N\times fr)$, thereby generating spurious signals in the oscillator output of the voltage-control oscillator 4.

As shown in FIG. 3D, a jitter width tj during which the charge-pump-output current Icp becomes a minimum is widen as accumulation takes place at each phase-comparison cycle, and returns to the narrowest width at the fourth phase-comparison cycle. Changes in the jitter width tj of the charge-pump-output current Icp is associated with the accumulated value acm of the accumulator 7. As shown in FIG. 3E, the output current Iad of the D/A converter 9 used for spurious suppression is designed to have opposite polarizations (plus v.s. minus) to the charge-pump-output current Icp, and, also, is designed to have a current amount, when integrated over time, the same amount as that of the charge-pump-output current Icp, which is achieved by making Iad proportional to the accumulated value acm of the accumulator 7. Because of this, the current Do input to the loop filter 3 has no periodic fluctuations, and, thus, spurious in the output of the voltage-control oscillator 4 is suppressed.

The fractional-N-frequency synthesizer of the related art described above, however, suffers a problem in that the spurious signals in the output of voltage-control oscillator exhibits channel-dependent characteristics. The channel dependency of spurious signals means that a spurious signal-suppression effect by the spurious signal suppressing circuit 8 will be affected when the frequency-division ratio N of the frequency divider 5 is changed to a new ratio with an aim of switching a frequency generated by the fractional-N-frequency synthesizer.

Reasons why such channel dependency is observed in spurious signals will be described below.

The minimum jitter width tj of the charge-pump-output current Icp is represented as:

$$tj = 1/fr - N/fo$$

$$= 1/fr \times [1 - N/(N + F/2^n)]$$

$$= 1/fr \times F/(F + N \times 2^n)$$

If F=1, then, the above equation is reduced to $$tj=1/fr \times 1/(1+N\times 2^n) \quad (3)$$

This jitter width tj changes from tj, 2×tj, to 3×tj as shown in FIG. 3F since a phase difference is accumulated at each phase-comparison cycle. Since the amount of the D/A-converter-output current Iad is the same, when integrated over time, as that of the charge-pump-output current Icp with an aim of canceling the jitter, a width tad of the D/A-converter output should satisfy Icp×tj=Iad×tad that is, Iad=(Icp×tj)/tad By substituting the equation (3) for tj, $$Iad=1/fr \times 1/(1+N\times 2^n)\times Icp/tad \quad (4)$$

is obtained.

When the frequency-division ratio N of the frequency divider 5 is changed, i.e., when the channel of the frequency synthesizer is changed, as can be seen from the equation (4), the D/A-converter-output current Iad is displaced from an optimal current level suitable for suppressing spurious signals, depending on the frequency-division ratio N since fr, n, Icp, and tad are all constant. Because of this, the spurious signals suppressing circuit 8 of the related art could not remove the channel dependency of spurious signals from the fractional-N-frequency synthesizer.

Accordingly, there is a need to prevent the channel dependency of spurious signals in a fractional-N-frequency synthesizer by maintaining a spurius signal-suppression effect even when a frequency-division ratio is changed upon channel switching.

SUMMARY OF THE INVENTION

Accordingly, it is a general object of the present invention to satisfy the need described above.

It is another and more specific object of the present invention to prevent the channel dependency of spurious signals in a fractional-N-frequency synthesizer by maintaining a spurious signal-suppression effect even when a frequency-division ratio is changed upon channel switching.

In order to achieve the above objects according to the present invention, a device for suppressing spurius signals generated by a fractional-N synthesizer which generates an output frequency is proposed where an underlying PLL circuit uses a frequency divider for dividing the output frequency by a frequency-division ratio to obtain a comparison frequency and performs phase-comparison operations between a reference frequency and the comparison frequency to control the output frequency, the output frequency being changed by a frequency interval smaller than the reference frequency by making a temporal change to the frequency-division ration once in every predetermined number of cycles. The device for suppressing spurious signals includes a current-generation unit which generates an electrical current proportional to a value representing an ordinal position of a current cycle in the ever predetermined number of cycles, and a current-summation unit which adds the electrical current to another electrical current controlling the output frequency in synchronism with the phase-comparison operations for a duration proportional to a cycle of the output frequency.

The device described above effectively suppresses the channel dependency of spurious signals as described below.

The electrical current output from the current-generation circuit is denoted as Iss, which is represented by the equation (4) by substituting Iss for Iad. The equation (4) is transformed by using the equation (2) in which F is equal to 1. Then, one can obtain $$Iss = 1/fo \times (\frac{1}{2}^n) \times (Icp/tad) \quad (5)$$

Since tad is the duration proportional to the cycle of the output frequency, tad is represented as:

$$tad = m/fo \, (m:arbitrary) \quad (6)$$

By combining the equation (6) and the equation (5) together, one can obtain $$Iss = 1/(2^n \times m) ICP \quad (7)$$

Since n, m, and Icp are constant, Iss is not dependent on the frequency-division ratio N as can be seen from the equation (7). The channel dependency of spurious signals, therefore, is suppressed in the frequency spectrum of the output frequency.

According to one aspect of the present invention, the device described above is such that the current-summation unit includes a pulse-generation unit which generates pulses each having a pulse width proportional to the cycle of the output frequency in synchronism with the phase-comparison operations, and a duration-adjustment unit which adjusts a timing and a duration as to when and how long the electric current is added to said another electrical current based on the pulses.

In the device described above, the duration proportional to the cycle of the output frequency can be readily established by the pulse-generation circuit having a relatively simple circuit structure.

According to another aspect of the present invention, the device is such that the current-summation unit receives a signal having a cycle proportional to the cycle of the output frequency from one of internal signal lines of the frequency divider, and determines the duration based on the signal.

In the device described above, the duration proportional to the cycle of the output frequency can be derived from one of the various frequencies available inside the frequency divider, so that there is no need to provide a special device dedicated for the purpose of frequency conversion, thereby simplifying the configuration of the spurious signal suppressing device.

According to another aspect of the present invention, the device further includes a selection switching unit which selects one of the internal signal lines of the frequency divider so as to supply a signal of the selected one of the internal signal lines to the current-summation unit.

In the device described above, a frequency most effective in terms of suppressing the channel dependency of spurious signals can be selected and used.

According to another aspect of the present invention, the device described above is such that the current-summation unit receives the comparison frequency from the frequency divider, and determines the duration based on the comparison frequency.

In the device described above, the output of the frequency divider is utilized as it is. Since the output frequency of the frequency divider is in synchronism with the phase-comparison operations of the phase comparator, there is no need for a special device dedicated for the purpose of establishing synchronization, and thereby a simple circuit structure suffices to implement the spurious signal suppressing device.

According to another aspect of the present invention, the device described above is such that the current-summation unit receives the output frequency, and determines the duration based on the output frequency.

In the device described above, a duration proportional to the cycle of the output frequency can be precisely obtained. Further, where it is desirable to use the same frequency as the output frequency, this configuration can provide the most appropriate circuit structure.

According to another aspect of the present invention, the device described above is such that the current-summation unit includes a frequency divider to divide the output frequency, and determines the duration based on a divided frequency of the output frequency.

In the device described above, the frequency divider having an appropriate frequency-division ratio can provide a desirable cycle which is not dependent on the frequency-division ratio of the frequency divider of the fractional-N synthesizer.

According to another aspect of the present invention, the device described above is such that the frequency divider of the current-summation unit is capable of changing a frequency-division ratio thereof.

In the device described above, any long or short duration proportional to the cycle of the output frequency can be obtained by changing the frequency-division ratio.

According to another aspect of the present invention, the device described above is such that the current-summation unit includes a frequency multiplying unit to multiply the output frequency by an integer, and determines the duration based on an output of the frequency multiplying unit.

In the device described above, a duration shorter than the cycle of the output frequency can be used as being proportional to the cycle of the output frequency.

According to another aspect of the present invention, a device for suppressing spurious signals is directed to a fraction-N synthesizer which includes a phase comparator for detecting a phase difference between two signals, a charge-pump circuit for outputting an electrical current varying in accordance with the phase difference detected by the phase comparator, a loop filter for converting the electrical current to a voltage, an oscillator for outputting a frequency based on the voltage, a frequency divider for dividing the frequency by a frequency-division ratio to supply a resulting signal to the phase comparator as one of the two signals, and a frequency-division-ratio switching circuit for holding a value that changes by a constant step in synchronism with phase-comparison operations of the phase comparator so that the value causes one of overflow and underflow once in a predetermined period and for switching the frequency-division ratio fo the frequency divider to another frequency-division ratio only when one of the overflow and the underflow is detected. The device for suppressing spurious signals includes a current-generation unit which generates an electrical current proportional to the value of the frequency-division-ratio switching circuit, and a current-summation unit which adds the electrical current of the current-generation unit to the electrical current of the charge-pump circuit in synchronism with the phase-comparison operations of the phase comparator for a duration proportional to a cycle of the frequency of the oscillator.

The device described above can effectively suppress the channel dependency of spurious signals in the same manner as the device previously described.

According to another aspect of the present invention a fractional-N synthesizer includes a phase comparator for detecting a phase difference between two signals, a charge-pump circuit for outputting an electrical current varying in accordance with the phase difference detected by the phase comparator, a loop filter for converting the electric current to a voltage, an oscillator for outputting a frequency based on the voltage, a frequency divider for dividing the frequency by a frequency-division ratio to supply a resulting signal to the phase comparator as one of the two signals, a frequency-division-ratio switching circuit for holding a value that changes by a constant step in synchronism with phase-comparison operations of the phase comparator so that he value causes one of overflow and underflow once in a predetermined period and or switching the frequency-division ratio fo the frequency divider to another frequency-division ratio only when one of the overflow and the underflow is detected, a current-generation unit which generates an electrical current proportional to the value of the frequency-division-ratio switching circuit, and a current-summation unit which adds the electrical current of the current-generation unit to the electrical current of the charge-pump circuit in synchronism with the phase-comparison operations of the phase comparator for a duration proportional to a cycle of the frequency of the oscillator.

The fractional-N synthesizer described above can effectively suppress the channel dependency of spurious signals in the same manner as the device previously described.

According to another aspect of the present invention, a method of suppressing spurius signals is directed to a fractional-N synthesizer which includes a phase comparator for detecting a phase difference between two signals, a charge-pump circuit for outputting an electrical current varying in accordance with the phase difference detected by the phase comparator, a loop filter for converting the electrical current to a voltage, an oscillator for outputting a frequency based on the voltage, a frequency divider for dividing the frequency by a frequency-division ratio to supply a resulting signal to the phase comparator as one of the two signals, and a frequency-division-ratio switching circuit for holding a value that changes by a constant step in synchronism with phase-comparison operations of overflow and underflow once in a predetermined period and for switching the frequency-division ratio of the frequency divider to another frequency-division ratio only when one of the overflow and the underflow is detected. The method includes the steps of a) generating an electrical current proportional to the value of the frequency-division-ratio switching circuit, b) adding the electrical current of the step a) to the electrical current of the charge-pump circuit in synchronism with the phase-comparison operations of the phase comparator, and c) adjusting a duration of the adding of the step b) to be proportional to a cycle of the frequency of the oscillator.

The method described above can effectively suppress the channel dependency of spurious signals in the same manner as the device previously described.

Other objects and further features of the present invention will be apparent from the following detailed description when read in conjunction with the accompanying drawings.

BRIEF DESCRIPTION OF THE DRAWINGS

FIGS. 8A through 8D are timing charts showing examples of signals P1 through P4;

DESCRIPTION OF THE PREFERRED EMBODIMENTS

In the following, embodiments of the present invention will be described with reference to the accompanying drawings.

Figure 4:
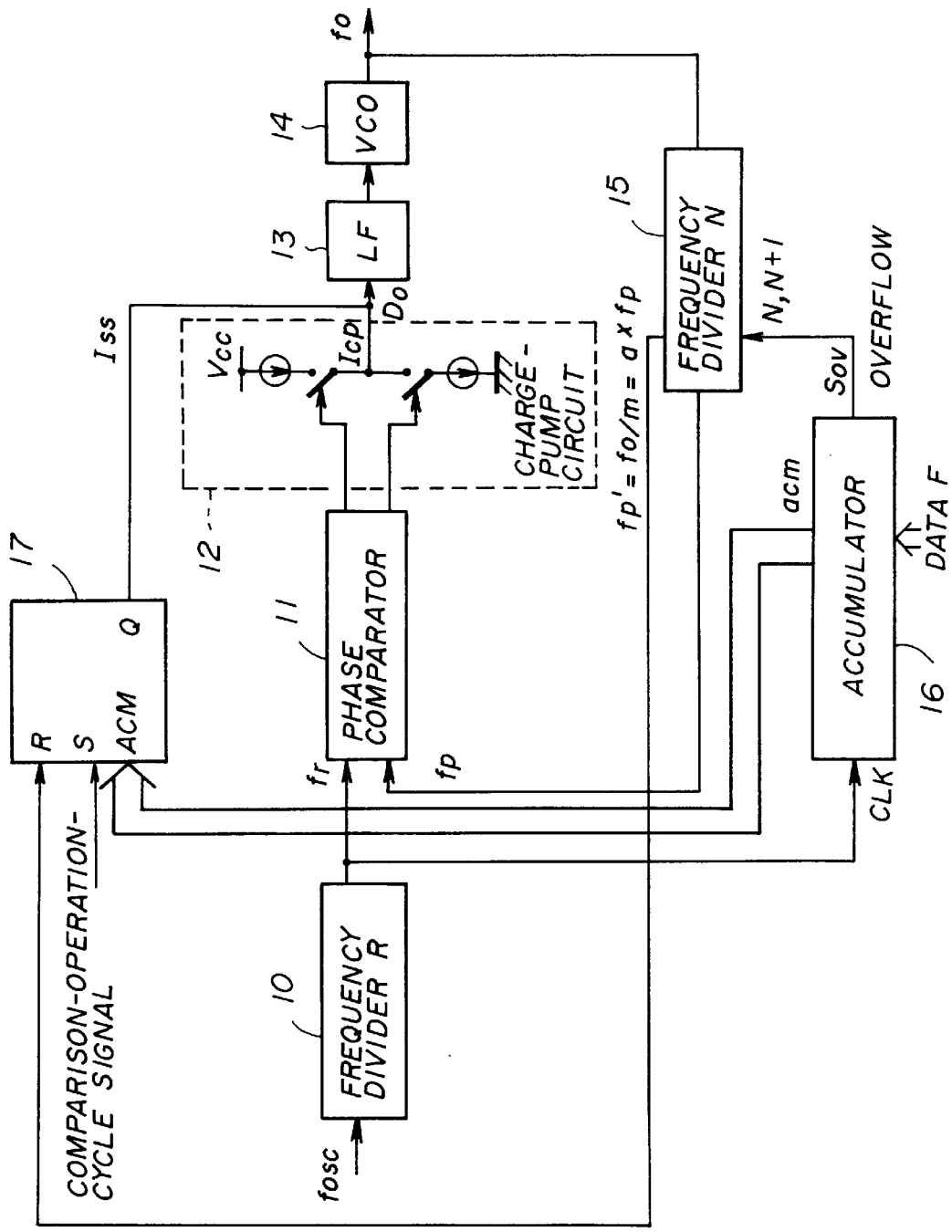
FIG. 4 is a block diagram of a first embodiment of a fractional-N-frequency synthesizer equipped with a spurious signal suppressing device according to the present invention.

FIG. 4 is a block diagram of a first embodiment of a fractional-N-frequency synthesizer equipped with a spurius signal suppressing device according to the present invention.

As shown in FIG. 4, the fractional-N-frequency synthesizer includes a frequency divider 10, a phase comparator 11, a change-pump circuit 12, a loop filter 13, a voltage-control oscillator 14, a frequency divider 15, an accumulator 16, and a spurius signal suppressing circuit 17.

The frequency divider 10 receives a frequency fosc output from a quartz oscillator (not shown) or the like, and divides the frequency by a frequency-division ratio R to generate a signal having a reference frequency fr, which is supplied to the phase comparator 11. The phase comparator 11 detects a phase difference between the signal having the reference frequency fr and a signal having the comparison frequency fp, and outputs a voltage pulse having a pulse width in accordance with the phase difference. This voltage pulse is supplied to the charge-pump circuit 12.

In response to the output from the phase comparator 11, the charge-pump circuit 12 generates a charge-pump-output current Icp, which has one of the three states, i.e., a flowing-out state, a flowing-in state, and a high-impedance state. The loop filter 13 smoothes the charge-pump-output current Icp from the charge-pump circuit 12, and converts the same into a voltage signal, which is supplied to the voltage-control oscillator 14.

The voltage-control oscillator 14 generates a signal having a frequency fo, which is controlled by the voltage signal supplied from the loop filter 13. The frequency divider 15 divides the frequency fo output from the voltage-control oscillator 14 by N or N+1, and feeds back the frequency-divided signal having the comparison frequency fp to the phase comparator 11. Here, the frequency-division ratio N is adjustable.

The accumulator 16 receives the reference frequency fr from the frequency divider 10 as a clock frequency, and obtains a sum of an accumulated value acm and input data F at each phase-comparison cycle employed by the phase comparator 11. The accumulated value acm of the accumulator 16 is updated by this sum (i.e., the accumulated value plus an increment F) at each phase-comparison cycle in this manner. In the example of FIG. 4, the accumulator 16 uses the reference frequency fr as a clock frequency thereof. Alternately, the clock frequency may be the comparison frequency fp or any other frequency signal as long as the frequency thereof corresponds to the phase-comparison cycles of the phase comparator 11.

If the accumulator 16 has a n-bit configuration, an overflow occurs when the accumulated value acm becomes $2^n$. When this happens, the accumulator 16 outputs an overflow signal Sov to the frequency divider 15. The frequency divider 15 changes the ratio of frequency division from N to N+1 during a phase-comparison cycle at which the overflow is detected. Namely, the frequency-division ratio of the frequency divider 15 becomes N+1 F times in every $2^n$ phase-comparison cycles.

Figure 1:
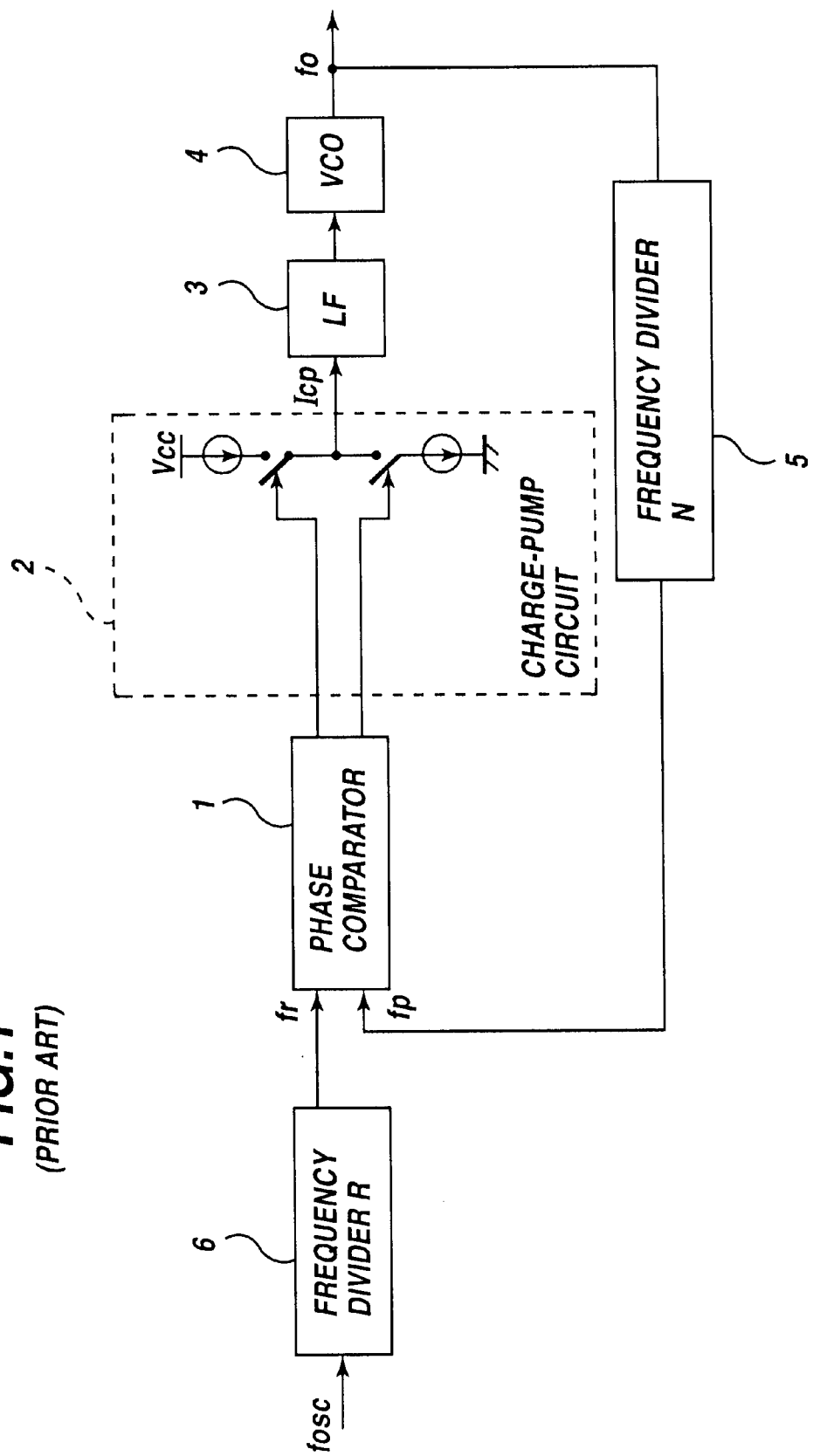
FIG. 1 is a block diagram of a PLL-frequency synthesizer generally used in the related art.
Figure 2:
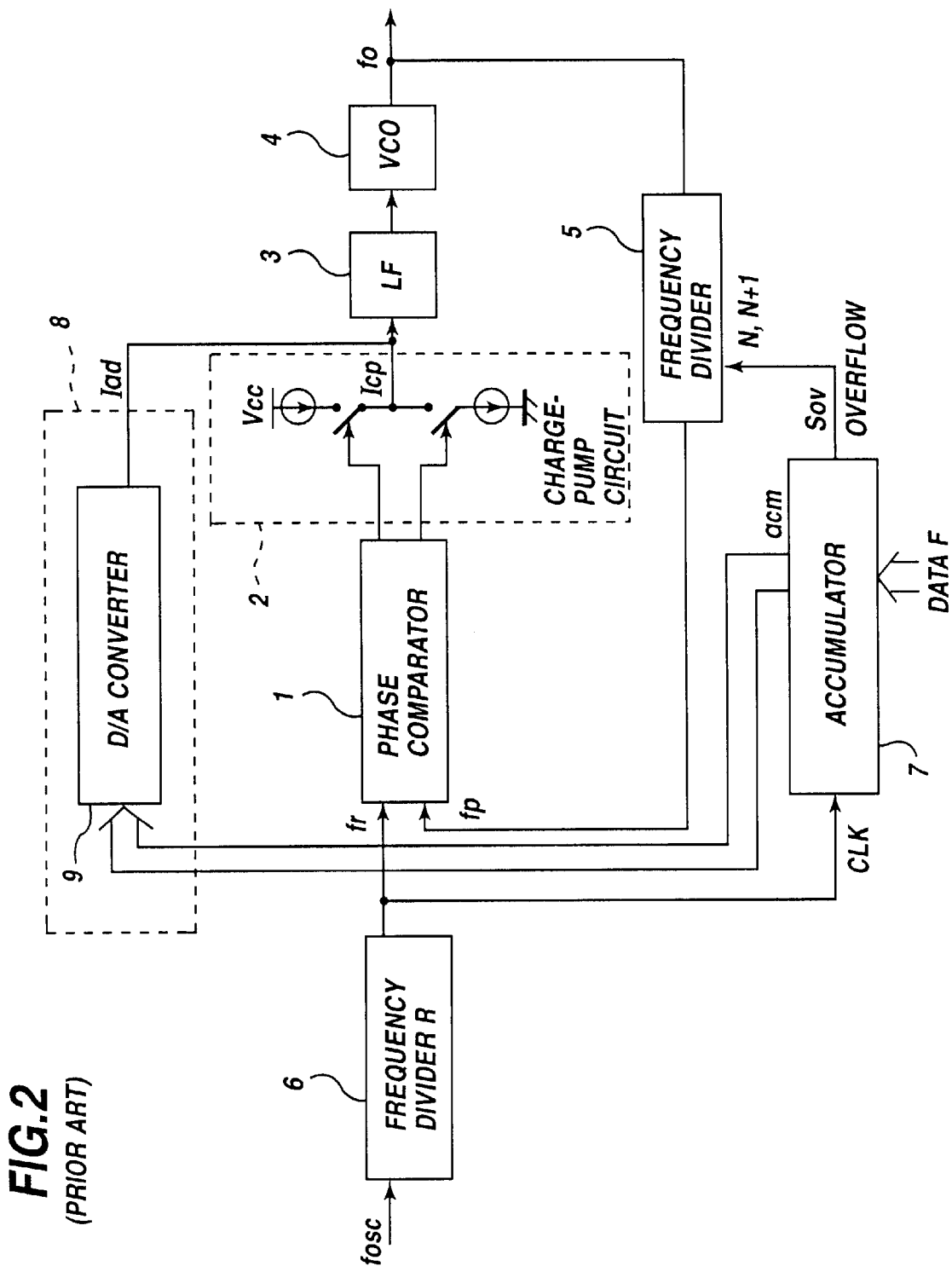
FIG. 2 is a block diagram of a fractional-N-frequency synthesizer used in the related art.
Figure 3:
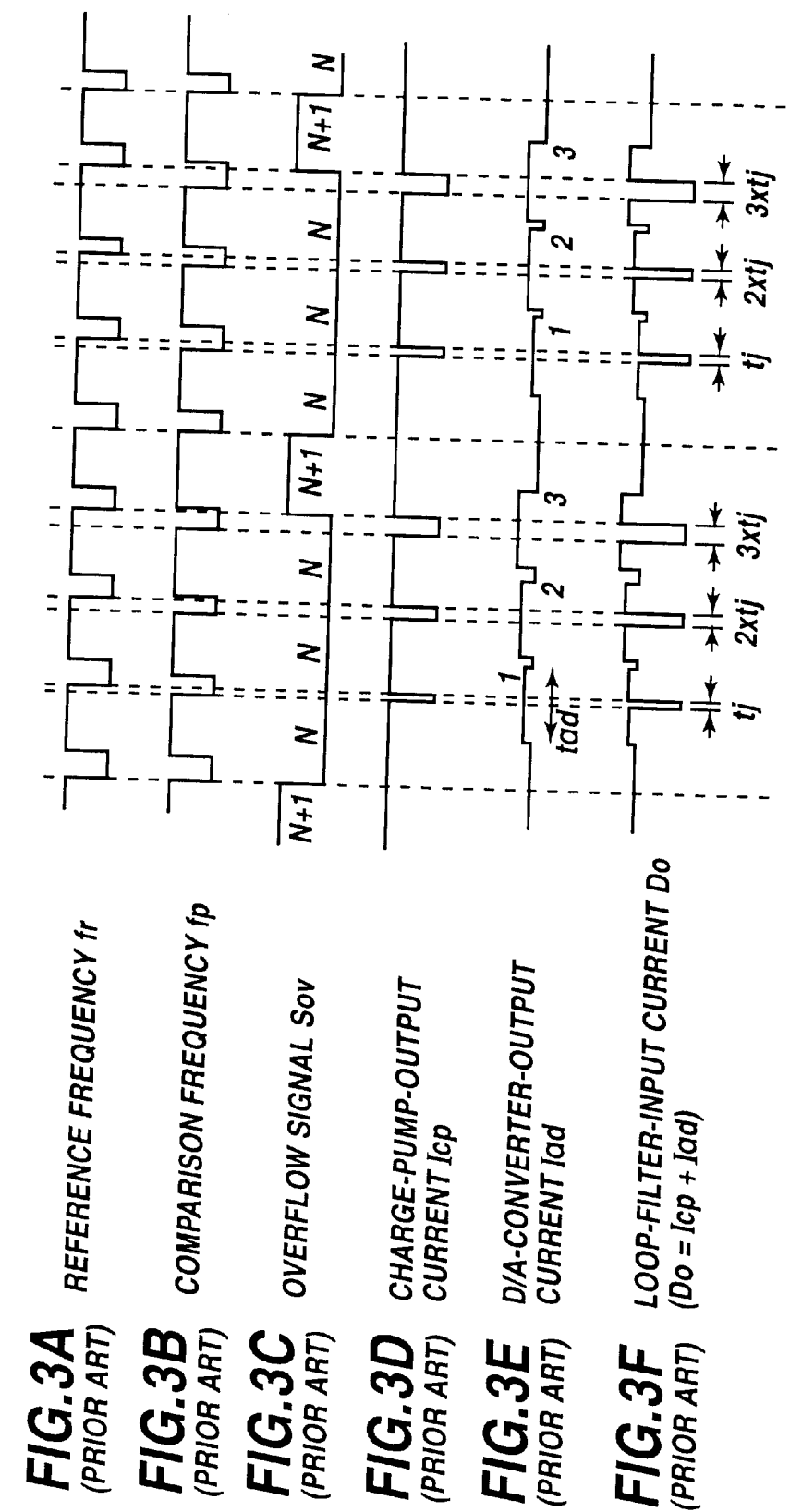
FIGS. 3A through 3F are timing charts showing relations between a reference frequency, a comparison frequency, and an overflow signal; charge-pump-output current D/A-converter-output-curent, and loop-filter-input current, respectively.

Operations as described above with regard to the frequency divider 10, the phase comparator 11, the charge-pump circuit 12, the loop filter 13, the voltage-control oscillator 14, the frequency divider 15, and the accumulator 16 are the same as those of the corresponding elements of the fractional-N-frequency synthesizer shown in FIG. 2. Namely, an average of the frequency fo of a voltage-control-oscillator output signal is represented as $fo=fr\times(N+F/2^n)$ as shown in the equation (2). By adjusting F as well as N, therefore, the average of the frequency fo output from the voltage-control oscillator 14 can be changed by a frequency interval smaller than the reference frequency fr.

The spurious signal suppressing circuit 17 is designed to add an electrical current proportional to the accumulated value acm of the accumulator 16 to the charge-pump-output current Icp of the charge-pump circuit 12, such that this addition takes place in synchronism with the phase-comparison operations of the phase comparator 11 for a duration commensurate with the output cycle of the voltage-control oscillator 14.

Figure 5:
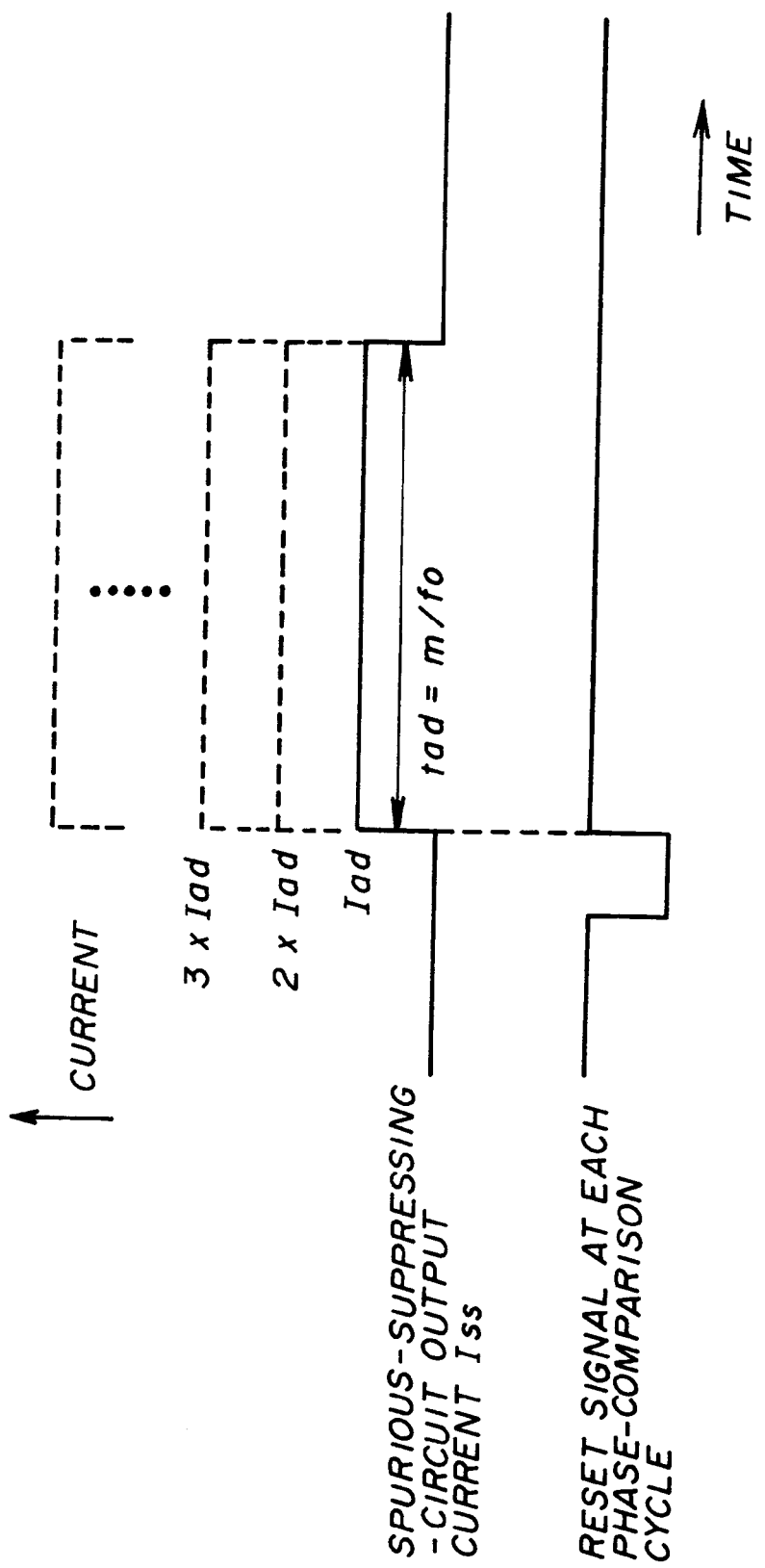
FIG. 5 is a timing chart showing an output current of a spurious signal suppressing circuit.

FIG. 5 is a timing chart showing the output current Iss of the spurious signal suppressing circuit 17.

This figure shows a case in which the accumulated value acm of the accumulator 16 is 1. In synchronism with a reset signal which itself is synchronized with the phase-comparison cycles of the phase comparator 11, the output current Iss is output by the spurious suppressing circuit 17 for a duration tad (=m/fo, m is arbitrary), which is proportional to the output cycle of the voltage-control oscillator 14. Changes in the output current Iss when the accumulated value acm of the accumulator 16 is changed from 1, 2, 3, and so on are shown by dashed lines in FIG. 5. In these circumstances, the output current Iss increases from Iad, 2×Iad, 3×Iad, and so on.

Figure 6:
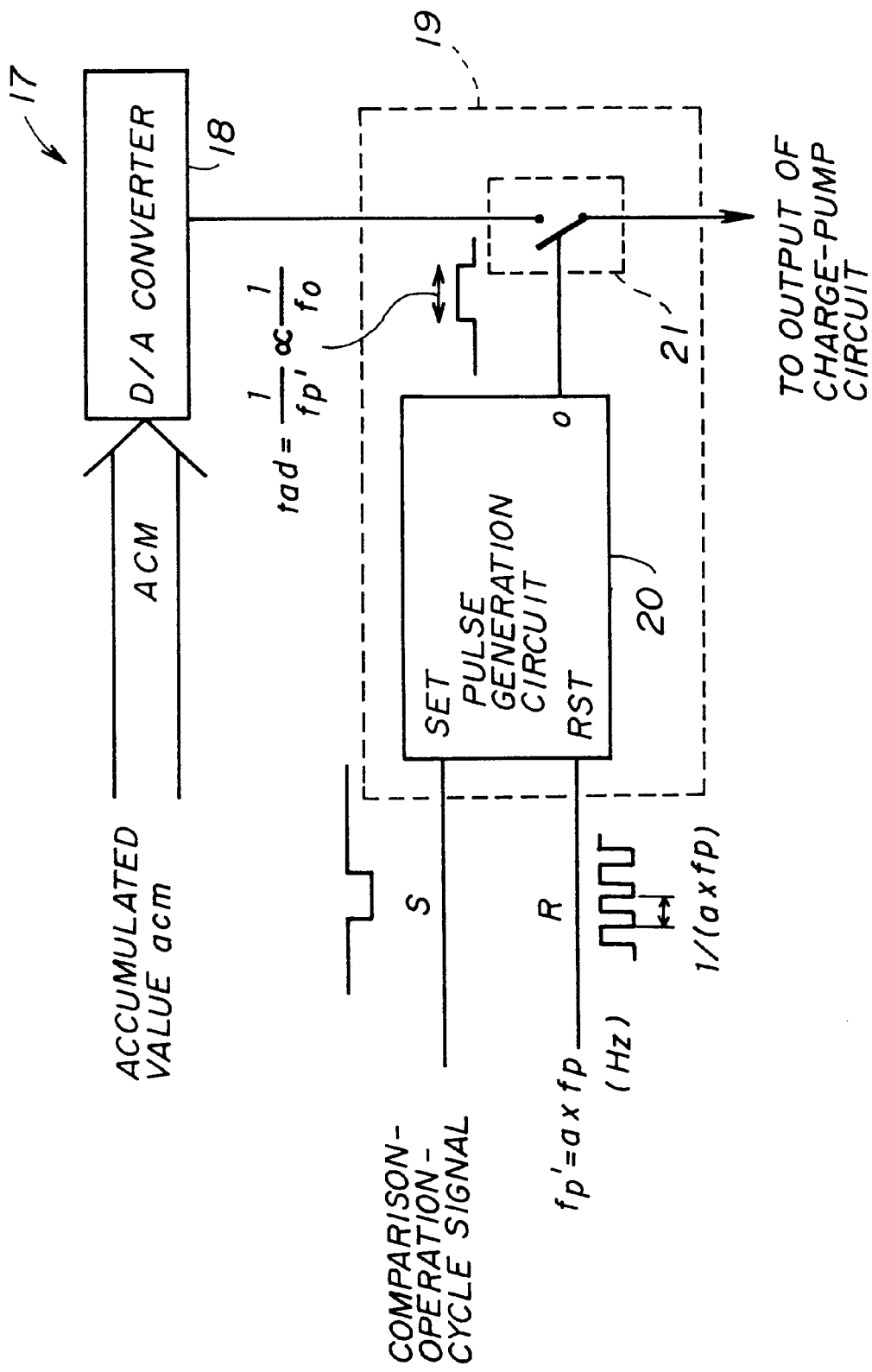
FIG. 6 is a block diagram showing a configuration of the spurious signal suppressing circuit.

FIG. 6 is a block diagram showing a configuration of the spurious signal suppressing circuit 17. As shown in the figure, the spurious signal suppressing circuit 17 includes a D/A converter (current-generation unit) 18 and a current-summation circuit 19. The D/A converter (current-generation unit) 18 receives the accumulated value acm, and generates a current which is in proportion to the accumulated value acm of the accumulator 16. The current-summation circuit 19 adds the output current of the D/A converter 18 to the charge-pump-output current Icp of the charge-pump circuit 12 in synchronism with the phase-comparison operations of the phase comparator 11. The addition is performed for a duration tad which is proportional to the output cycle of the voltage-control oscillator 14 (i.e., tad is proportional to 1/fo).

The current-summation circuit 19 includes a pulse-generation circuit 20 and a switch circuit (duration-adjustment unit) 21. The pulse-generation circuit 20 receives a signal having a frequency fp' proportional to the output frequency fo of the voltage-control oscillator 14, and, also, receives a phase-comparison-operation synchronizing signal which is comprised of pulses generated at each phase-comparison cycle of the phase comparator 11. These signals are supplied from the frequency divider 15 by extracting relevant signals from one of the internal signal lines of the frequency divider 15. The frequency fp', which is in proportion to the output frequency fo of the voltage-control oscillator 14, is also proportional to the comparison frequency fp, and is represented as fp'=a×fp (a is arbitrary). The pulse-generation circuit 20, based on the supplied signals, generates pulses each having a pulse width tad (=1/(a×fp)), which is proportional to the cycle (1/fo) of the oscillating output of the voltage-control oscillator 14. These pulses are in synchronism with the phase-comparison operations of the phase comparator 11.

The switch circuit (duration-adjustment unit) 21 adjusts a timing and a duration of the adding operation when the current supplied from the D/A converter 18 is added to the charge-pump-output current Icp of the charge-pump circuit 12. This adjustment is made based on the pulses generated by the pulse-generation circuit 20. In detail, the switch circuit 21 is comprised of a switch provided on a signal line, along which the output current of the D/A converter 18 flows. This switch is connected only during a period when a pulse from the pulse-generation circuit 20 is supplied.

Figure 7:
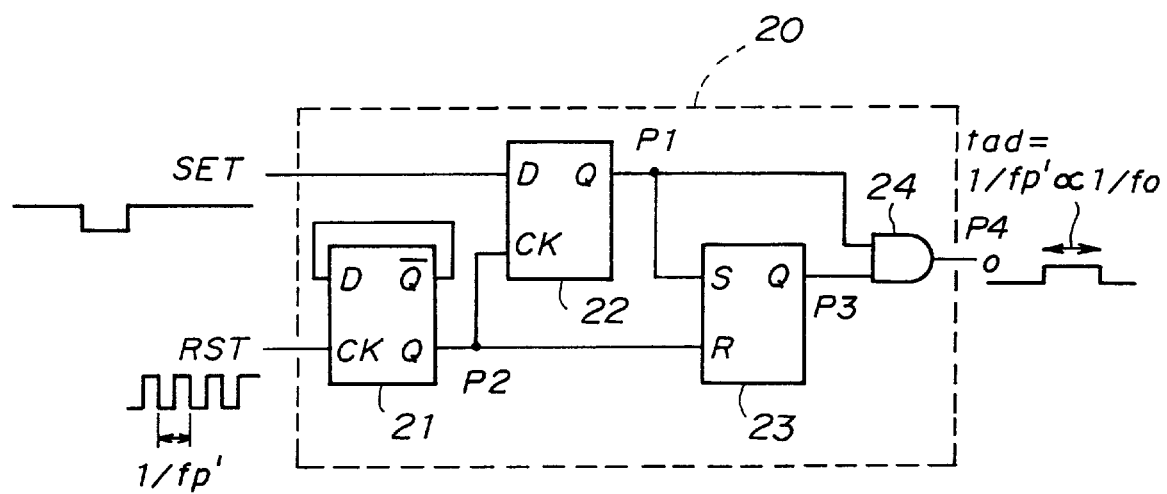
FIG. 7 is a circuit diagram of an example of a pulse-generation circuit.

FIG. 7 is a circuit diagram of an example of the pulse-generation circuit 20.

The pulse-generation circuit 20 of FIG. 7 includes D-flip-flops 21 and 22, an SR latch 23, and an AND gate 24. The D-flip-flop 21 receives as a RST signal the signal having the frequency fp' from the frequency divider 15, and generates a signal P2 comprised of pulses having a width of 1/fp'. The D-flip-flop 22 receives the phase-comparison-operation synchronizing signal as a SET signal, and outputs a signal P1 in synchronism with the RST signal. The SR latch 23 receives the signal P1 from the D-flip-flop 22 as a set signal and the signal P2 from the D-flip-flop 21 as a reset signal, and outputs a signal P3. The signal P3 becomes HIGH at the timing of the set signal and LOW at the timing of the reset signal. The AND gate 24 receives the signal P1 from the F-flip-flop 22 and the signal P3 from the SR latch 23, and generates a pulse signal P4, which is an output of the pulse-generation circuit 20.

Extraction of the frequency fp' from the frequency divider 15 will be described below.

In the following, extraction of the frequency fp' from the frequency divider 15 will be described.

Figure 9:
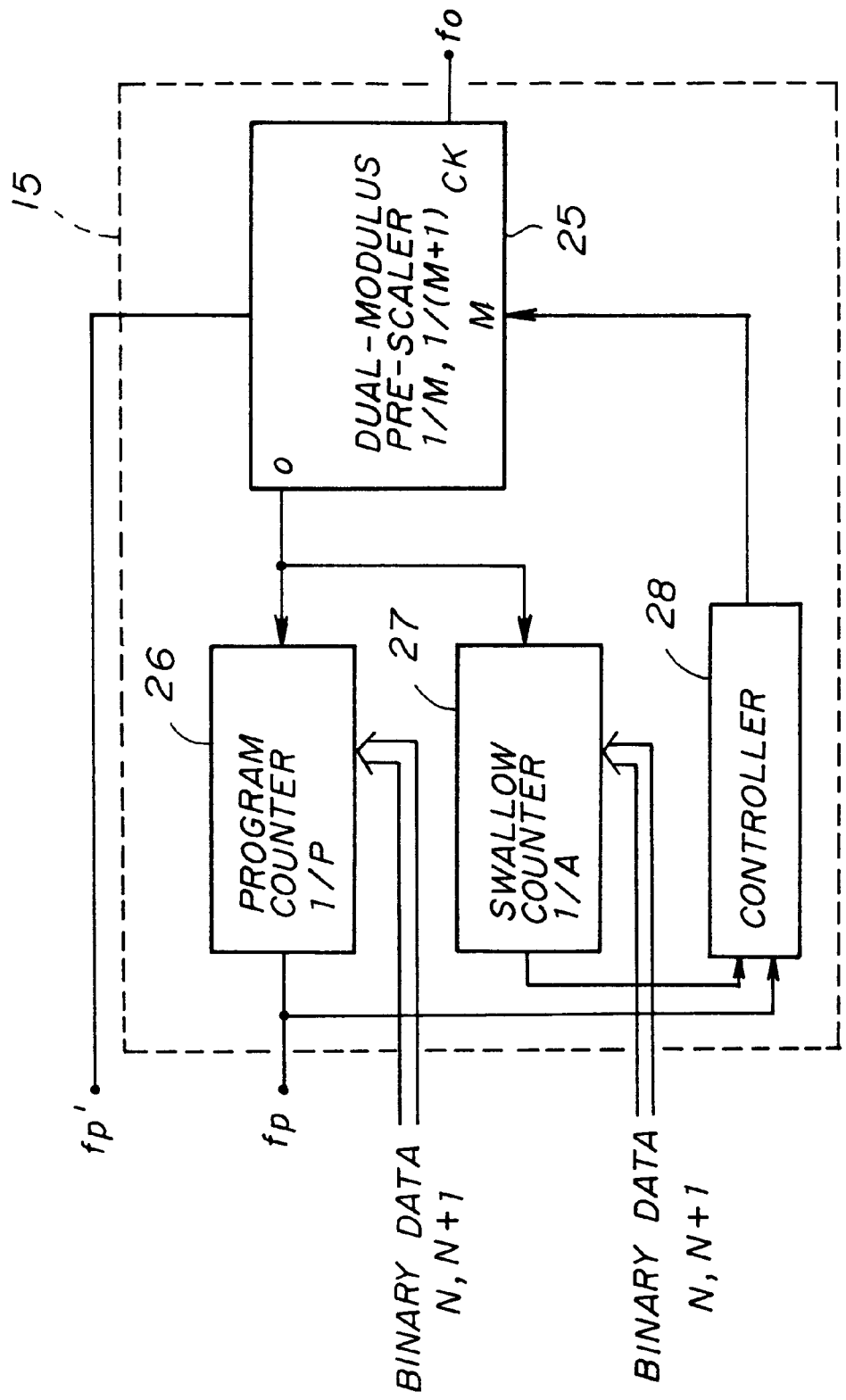
FIG. 9 is a block diagram showing an example of a configuration of a frequency divider where a pulse-swallow scheme is employed.

FIG. 9 is a block diagram showing an example of a configuration of the frequency divider 15 where a pulse-swallow scheme is employed.

As shown in the figure, the frequency divider 15 includes a dual-modulus pre-scaler 25, a program counter 26, a swallow counter 27, and a controller 28. First, a pulse-swallow-type frequency divider will be described with regard to operations thereof. The program counter 26 and the swallow counter 27 start counting at the same time. While the swallow counter 27 counts a number up to A, the dual-modulus pre-scaler 25 operates under a M+1 frequency-division ratio. While the swallow counter 27 counts from A+1 to P, the dual-modulus pre-scaler 25 operates under a N frequency-division ratio. A frequency-division ratio N of the frequency divider 15 as a whole is thus represented by (M×P−A). Here, the program counter 26 and the swallow counter 27 each receives respective data to set the frequency-division ratio to N or N+1 when the respective data is supplied from a shift register, latch circuits, and so on (not shown).

Figure 10:
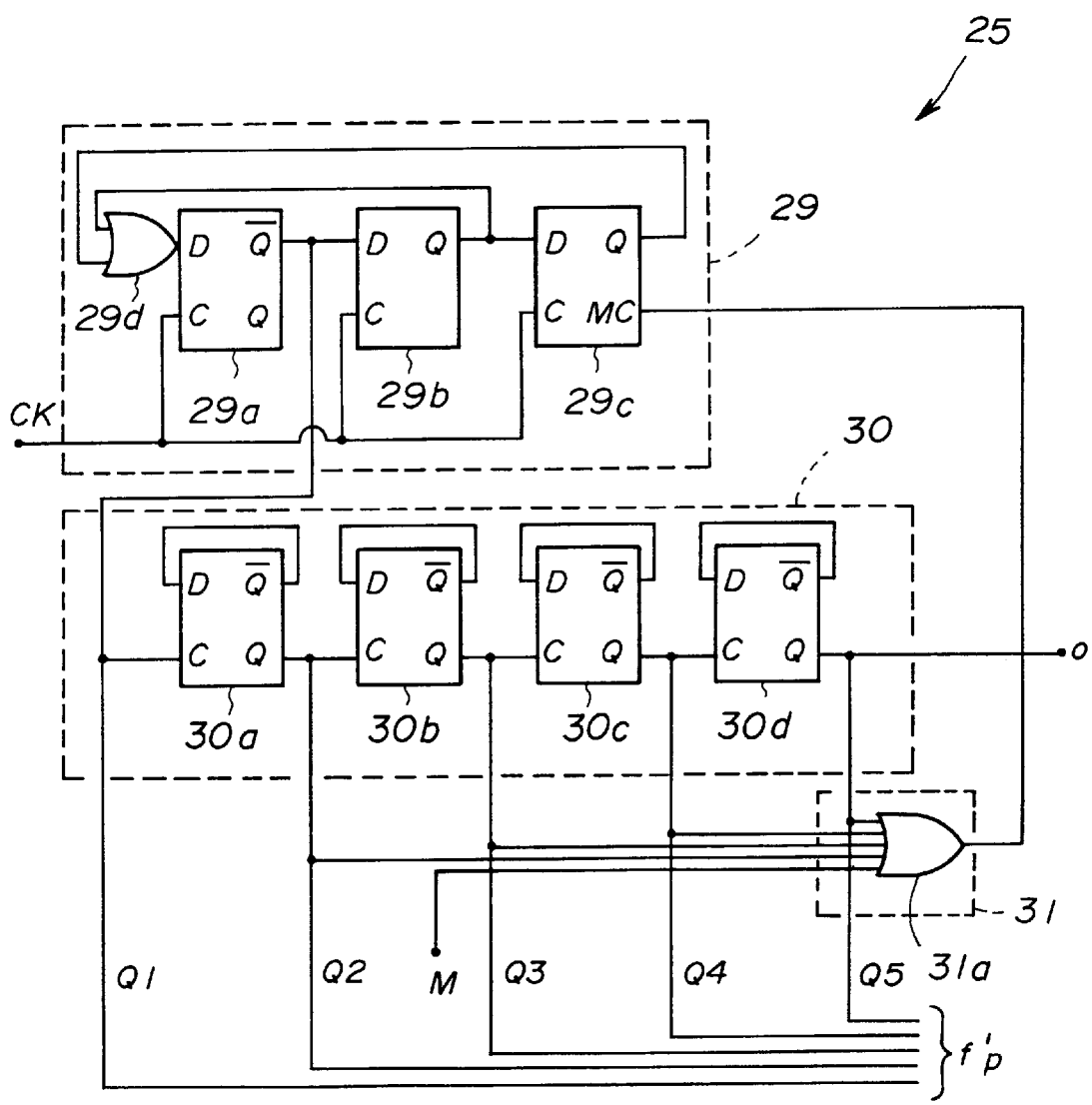
FIG. 10 is a circuit diagram of a dual-modulus pre-scaler.

FIG. 10 is a circuit diagram of the dual-modulus pre-scaler 25.

As shown in FIG. 10, the dual-modulus pre-scaler 25 includes a variable-frequency-division unit 29, a fixed-frequency-division unit 30, and a modulus-control unit 31. The variable-frequency-division unit 29 includes flip-flops 29a through 29c and an OR gate 29d, and the fixed-frequency-division unit 30 includes flip-flops 30a through 30d. Further, the modulus-control unit 31 includes a five-input-OR gate 31a. In this example, since the variable-frequency-division unit 29 is provided with three flip-flops (29a through 29c), a frequency-division ratio can be switched between four and five, depending on an input MC of the flip-flop 29c. Further, the fixed-frequency-division unit 30 is comprised of four flip-flops (30a through 30d), so that the dual-modulus pre-scaler 25 in an entirety thereof can switch a frequency-division ration between 64 and 65.

The signal having the frequency fp' supplied from the frequency divider 15 to the spurious suppressing circuit 17 can be extracted from the dual-modulus pre-scaler 25 by selecting one of an output Q1 of the flip-flop 29a of the variable-frequency-division unit 29, an output Q2 of the flip-flop 30a of the fixed-frequency-division unit 30, an output Q3 of the flip-flop 30b, an output Q4 of the flip-flop 30c, and an output Q5 of the flip-flop 30d. A position from which the signal of the frequency fp' is extracted is not limited to these examples. As long as a signal is proportional to the output frequency fo of the voltage-control oscillator 14, extraction from one of the internal signal lines in the program counter 26, the swallow counter 27, or the controller 28 may be appropriate.

Further, a selector may be provided for the purpose of selectively extracting the frequency fp' from the plurality of signal lines in the frequency divider 15, so as to allow a choice of fp' appropriate for avoiding the channel-dependent spurious.

FIGS. 11A through 11F are timing charts for explaining spurious suppressing operations.

In the fractional-N-frequency synthesizer as described above, the frequency-division ratio of the frequency divider 15 is periodically switched from N to N+1 in response to the overflow signal Sov (FIG. 11C) supplied from the accumulator 16. As a result, the output frequency fo of the voltage-control oscillator 14 experiences periodic changes between fo1 (=(N+1)×fr) and fo2 (=N×fr). This fluctuation acts to introduce a spurious signal into the output signal of the voltage-control oscillator 14. The spurius signal, however, is suppressed by the spurious signal suppressing circuit 17 as described in the following.

Figure 11:
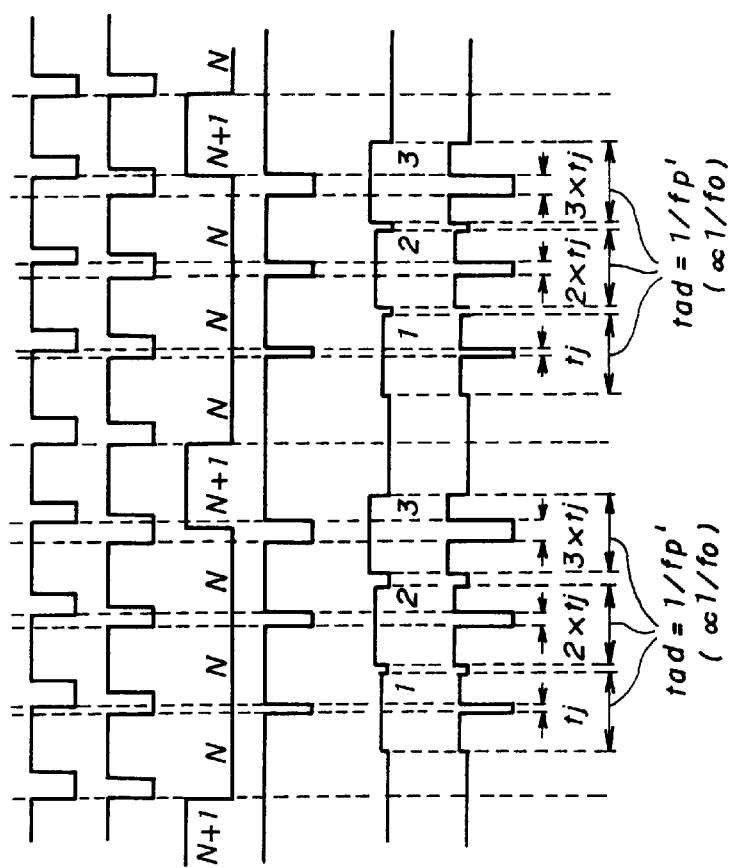
FIGS. 11A through 11F are timing charts for explaining spurious signal suppressing operations.

The accumulated value acm of the accumulator 16 is incremented by 1 (=F) at each phase-comparison cycle of the phase comparator 11, and returns to zero when overflow is detected. Namely, the accumulated value acm exhibits changes such as 0, 1, 2, 3, 0, 1, 2, 3, and so on. The accumulator 16 experiences an overflow once in every phase-comparison cycles, so that the overflow signal Sov of the accumulator 16 changes as shown in FIG. 11C. In this example, the accumulator 16 is of a 2-bit configuration, and the input data F is equal to 1.

The output current Iss of the spurius signal suppressing circuit 17, as shown in FIG. 11E, has an opposite polarization (plus v.s. minus) to that of the charge-pump-output current Icp. Further, the output current Iss has the same current amount as the charge-pump-output current Icp when being integrated over time. This is done by making the output current Iss proportional to the accumulated value acm. Accordingly, a current Do (FIG. 11F) obtained by adding the currents Icp and Iss together has an effect of periodic fluctuations canceled, resulting in spurius signals being suppressed in the oscillating output of the voltage-control oscillator 14.

In what follows, prevention of the channel dependency of spurious signals will be described.

The current generated by the D/A converter 18 of the spurious signal suppressing circuit 17 is output from the spurious signal suppressing circuit 17 is output from the spurious signal suppressing circuit 17, such that duration tad of the current is controlled by the current-summation circuit 19 to be proportional to the cycle of the oscillating output of the voltage-control oscillator 14. The control of the output current Iss with regard to the duration thereof insures that there is always a proportional relation between tad and 1/fo. That is, the equation (6) previously described is always satisfied. This in turn means that the equation (7), Iss=Icp× 1/($2^n$×m), is satisfied all the time. Since n, m, and Icp are constant, Iss is not dependent on the frequency-division ratio N.

In other words, even when the frequency-division ratio N is change, the output current Iss of the spurious signal suppressing circuit 17 is always adjusted to a precisely desired scale relative to the charge-pump-output current Icp of the charge-pump circuit 12. Changes in the frequency-division ratio of the frequency divider 15, therefore, do not undermine a spurious signal suppression effect of the spurious signal suppressing circuit 17, thereby reliably preventing channel-dependent spurious signals from appearing in the frequency spectrum of the voltage-control oscillator 14.

In this embodiment, the current-summation circuit 19 receives a signal having a frequency proportional to an output frequency of the voltage-control oscillator 14 by extracting such a signal from one of the plurality of signal lines included in the frequency divider 15, and, then, determines a period proportional to the output frequency of the voltage-control oscillator 14 based on the received signal. Because of this configuration, there is no need to provide a special device dedicated for frequency conversion, so that the configuration of the spurious signal suppressing circuit 17 can be more simplified than it otherwise could be.

Further, a selection switching circuit may be provided so as to select one of the plurality of signal lines included in the frequency divider 15, thereby supplying a signal from the selected signal line to the current-summation circuit 19. In this manner, a signal having the most appropriate frequency for the purpose of preventing the channel dependency of spurious signals can be selected and used.

In this embodiment, the accumulator 16 has been described as having the accumulated value thereof incremented. Alternately, an accumulator having an accumulated value thereof decreased may be used. In this case, the frequency-division ratio N is changed to N+1 when the accumulated value incurs underflow.

Figure 12:
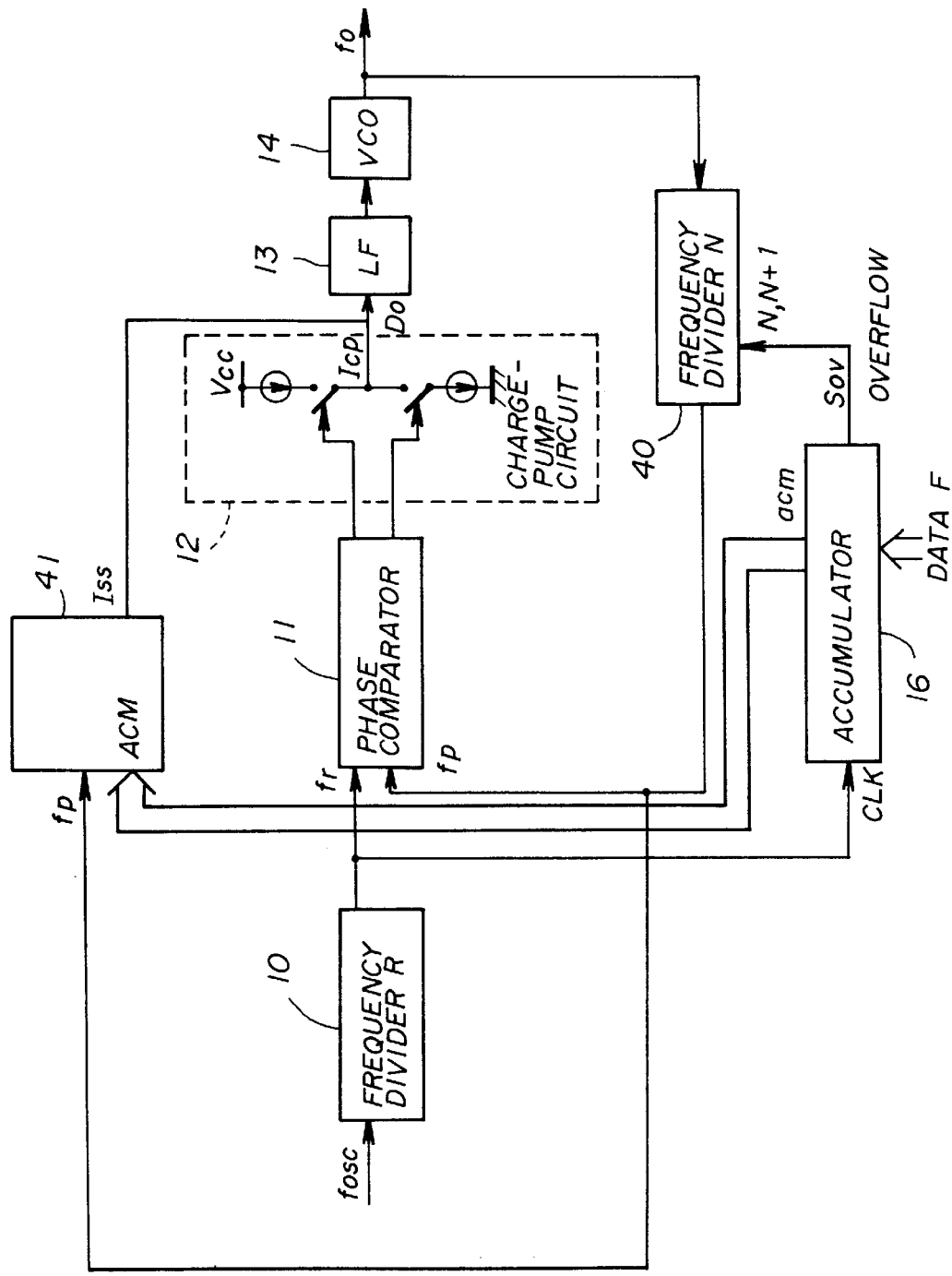
FIG. 12 is a block diagram showing a second embodiment of a fractional-N-frequency synthesizer in which a spurious signal suppressing device according to the present invention is employed.

FIG. 12 is a block diagram showing a second embodiment of a fractional-N-frequency synthesizer in which a spurious signal suppressing device according to the present invention is employed. In FIG. 12, the same elements as those of FIG. 4 are referred to by the same numerals, and a description thereof will be omitted for the purpose of avoiding duplicate descriptions.

The second embodiment shown in FIG. 12 includes a frequency divider 40 and a spurious signal suppressing circuit 41 which are different from those of the first embodiment.

The frequency divider 40 has the same configuration as a conventional frequency divider. That is, the frequency divider 40 differs from the frequency divider 15 of the first embodiment shown in FIG. 4 in which a frequency different from the frequency fp is extracted from an internal signal line of the frequency divider 15.

The spurious signal suppressing circuit 41 receives the same signal having the frequency fp supplied to the phase comparator 11 from the frequency divider 40, in addition to receiving the accumulated value acm from the accumulator 16. Based on the received signal and the accumulated value acm, the spurious signal suppressing circuit 41 adds an electrical current proportional to the accumulated value acm of the accumulator 16 to the charge-pump-output current Icp of the charge-pump circuit 12, such that this addition takes place in synchronism with the phase-comparison operations of the phase comparator 11 for a duration commensurate with the output cycle of the voltage-control oscillator 14.

Figure 13:
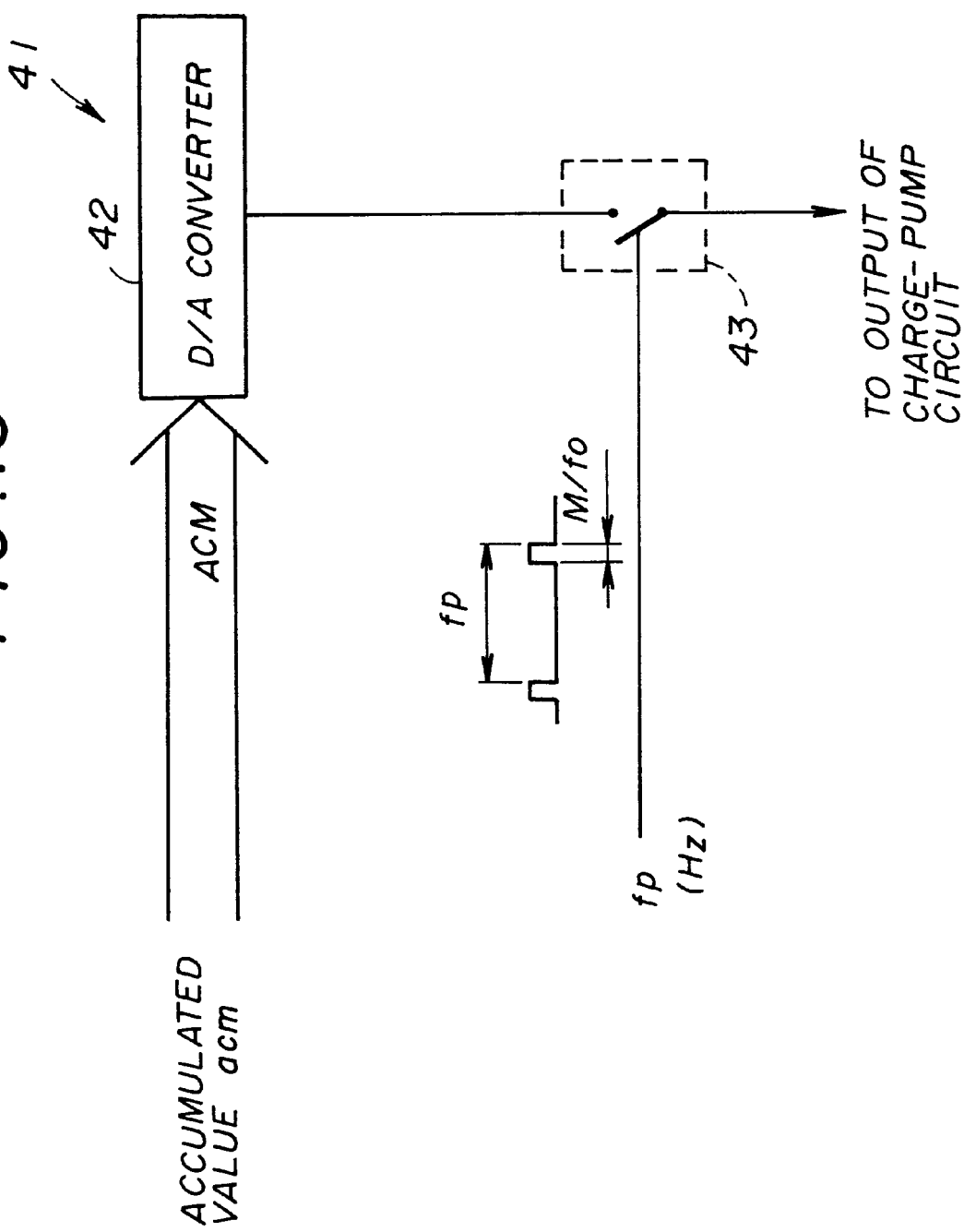
FIG. 13 is a block diagram showing a configuration of a spurious signal suppressing circuit shown in FIG. 12.

FIG. 13 is a block diagram showing a configuration of the spurious signal suppressing circuit 41.

As shown in FIG. 13, the spurious signal suppressing circuit 41 includes a D/A converter 42 and a switch circuit 43. The D/A converter 42 receives the accumulated value acm of the accumulator 16, and generates an electrical current proportional to the accumulated value acm. The switch circuit 43 is provided with the comparison frequency fp supplied from the frequency divider 40, and controls the connection/disconnection of an output signal line of the D/A converter 42. Based on the control, the output current Iss of the D/A converter 42 is output from the spurious signal suppressing circuit 41 in synchronism with the phase comparison operations of the phase comparator 11 for a duration equivalent to M/fp.

Since the duration tad during which the output current Iss of the spurious signal suppressing circuit 41 is output is M/fp, the present embodiment satisfies the requirement that the duration tad be proportional to 1/fo. The spurious signal suppressing circuit 41 of this embodiment, therefore, as so did the spurious signal suppressing circuit 17 of the first embodiment, can suppress spurious signals contained in the frequency spectrum of the oscillator output of the voltage-control oscillator 14, and, also, can maintain this spurious signal suppressing effect even when the frequency-division ratio N of the frequency divider 15 is changed in order to switch the channel, thereby successfully eliminating the channel dependency of spurious signals.

In this embodiment, further, the switch circuit 43 receives the same signal as supplied to the phase comparator 11 from the frequency divider 40, and determines the period proportional to the cycle of the output frequency of the voltage-control oscillator 14 based on the received signal. Since the output frequency of the frequency divider 40 is used as it is, and is actually in synchronism with the phase comparison operations of the phase comparator, there is no need to provide a special device dedicated for establishing synchronization. Because of this, a simple circuit structure can be employed when implementing the spurious signal suppressing circuit 41.

Figure 14:
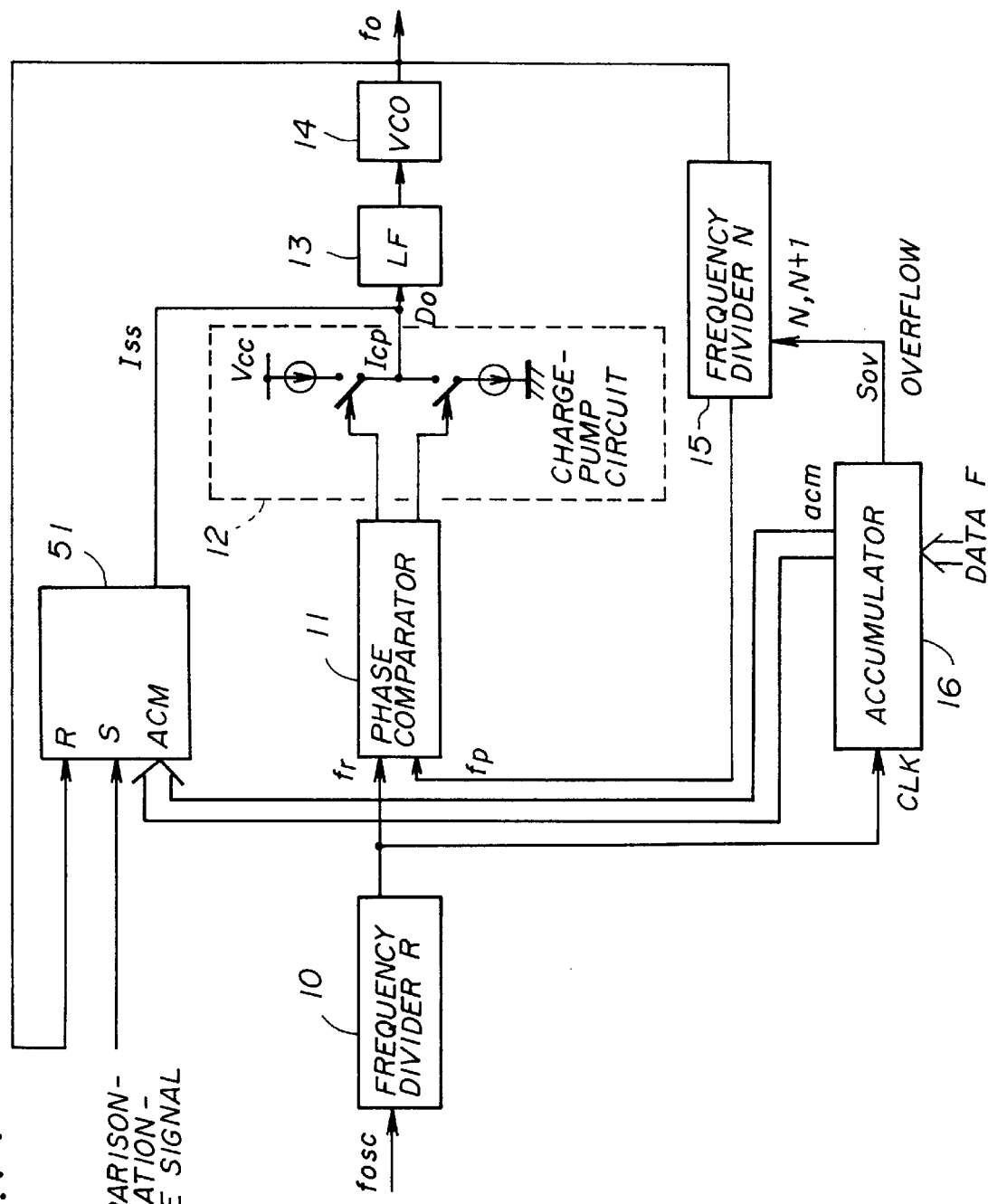
FIG. 14 is a block diagram showing a third embodiment of a fractional-N-frequency synthesizer in which a spurious signal suppressing device according to the present invention is employed.

FIG. 14 is a block diagram showing a third embodiment of a fractional-N-frequency synthesizer in which a spurious signal suppressing device according to the present invention is employed. In FIG. 14, the same elements as those of FIG. 4 and FIG. 12 are referred to by the same numerals, and a description thereof will be omitted fo the purpose of avoiding duplicate descriptions.

A spurious signal suppressing circuit 51 of FIG. 14 receives the output frequency fo of the voltage-control oscillator 14 in addition to the accumulated value acm of the accumulator 16 and the phase-comparison synchronization signal. Based on these received signals, the spurious signal suppressing circuit 541 adds an electrical current proportional to the accumulated value acm of the accumulator 16 to the charge-pump-output current Icp of the change-pump circuit 12, such that this addition takes place in synchronism with the phase-comparison operations of the phase comparator 11 for a duration commensurate with the output cycle of the voltage-control oscillator 14.

Figure 15:
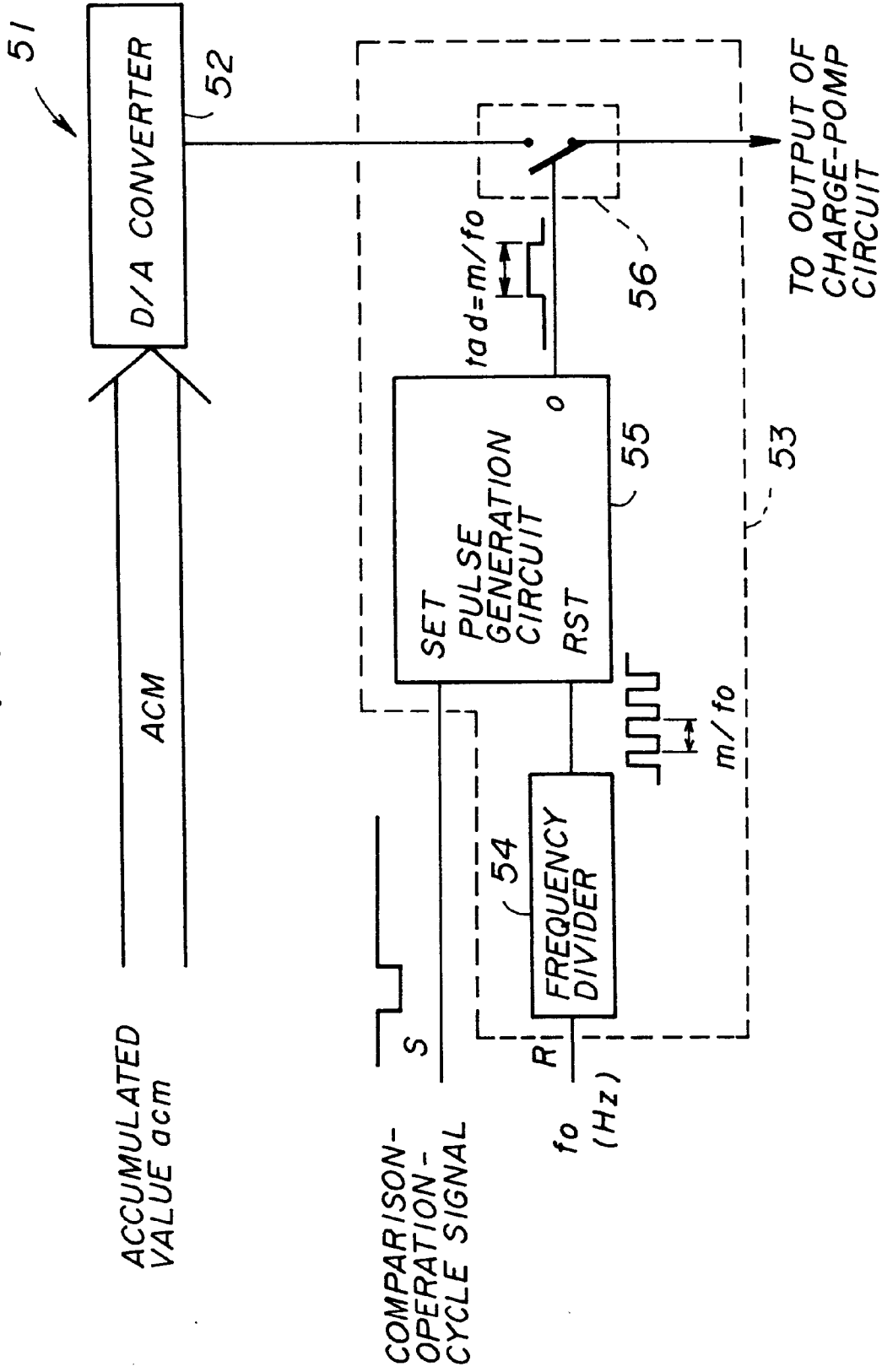
FIG. 15 is a block diagram showing a configuration of a spurius signal suppressing circuit shown in FIG. 14.

FIG. 15 is a block diagram showing a configuration of the spurious signal suppressing circuit 51.

As shown in FIG. 15, the spurious signal suppressing circuit 15 includes a D/A converter 52 and a current-summation circuit 53. The D/A converter 52 has the same configuration as the D/A converter 18 of FIG. 6, and receives the accumulated value acm of the accumulator 16, and generates an electrical current proportional to the accumulated value acm. The current-summation circuit 52, such that the output current of the D/A converter 52 is output from the spurious signal suppressing circuit 51 in synchronism with the phase-comparison operations of the phase comparator 11 for a duration tad proportional to the output cycle of the voltage-control oscillator 14 (i.e., tad=m/fo, m is arbitrary).

The current-summation circuit 53 includes a frequency divider 54, a pulse-generation circuit 55, a switch circuit 56. The frequency divider 54 receives the output frequency fo of the voltage-control oscillator 14, and divides the frequency fo by a predetermined frequency-division ratio m so as to supply the resulting frequency divided signal to the pulse-generation circuit 55. The pulse-generation circuit 55 has the same configuration as the pulse-generation circuit 20 of FIG. 7. The pulse-generation circuit 55, based on the supplied signals, generates pulses each having a pulse width tad (=m/fo), which is proportional to the cycle of the oscillating output of the voltage-control oscillator 14. These pulses are in synchronism with the phase-comparison operations of the phase comparator 11. The switch circuit 56 adjusts a timing and a duration of an adding operation when the current supplied from the D/A converter 52 is added to the charge-pump-output current Icp of the charge-pump circuit 12. This adjustment is made based on the pulses generated by the pulse-generation circuit 55. In detail, the switch circuit 56 is comprised of a switch provided on a signal line, along which the output current of the D/A converter 52 flows. This switch is connected only during a period when a pulse from the pulse-generation circuit 55 is supplied.

Since the duration tad during which the output current Iss of the spurious signal suppressing circuit 51 is output is m/fo, the present embodiment satisfies the requirement that the duration tad be proportional to 1/fo. The spurious signal suppressing circuit 51 of this embodiment, therefore, as so did the spurious signal suppressing circuit of the first and second embodiments, can suppress spurious signals contained in the frequency spectrum of the oscillator output of the voltage-control oscillator 14, and, also, can maintain this spurious signal suppressing effect even when the frequency-division ratio N of the frequency divider 15 is changed in order to switch the channel, thereby successfully eliminating the channel dependency of spurious signals.

Figure 16:
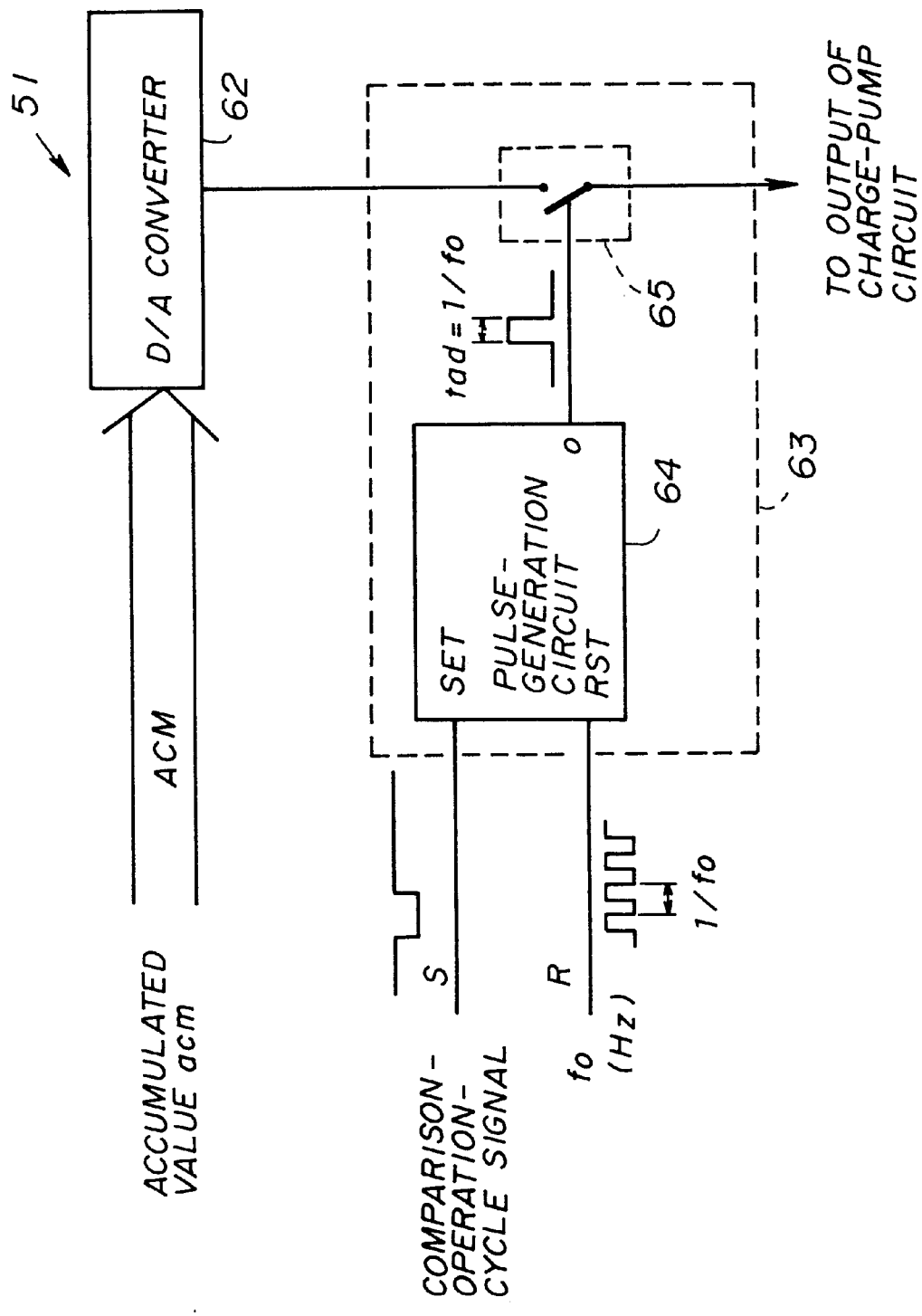
FIG. 16 is a block diagram showing another embodiment of the spurious signal suppressing circuit shown in FIG. 14.

FIG. 16 is a block diagram showing another embodiment of the spurious signal suppressing circuit 51.

The spurious signal suppressing circuit 51 of FIG. 15 is provided with the frequency divider 54 at a stage preceding to the pulse-generation circuit 55, thereby dividing the frequency fo before the pulse-generation circuit 55. On the other hand, the spurious signal suppressing circuit 51 of FIG. 16 includes a pulse-generation circuit 64 that receives the frequency fo directly. In this case, a duration tad during which the output current Iss of the spurious signal suppressing circuit 51 is output is 1/fo, so that the requirement that the duration tad be proportional to 1/fo is still satisfied. In this manner, the spurius signal suppressing circuit 51 of FIG. 16 can achieve the same advantages as the spurious signal suppressing circuit 51 of FIG. 15.

A current-summation circuit 63 receives the oscillating output of the voltage-control oscillator 14, and, based on this oscillating signal, determines a period proportional to the output cycle of the voltage-control oscillator 14. Because of this configuration, the duration tad proportional to the output cycle of the voltage-control oscillator 14 can be obtained with faster response characteristics. Further, this configuration is optimal when a period the same as that of the oscillating output should be utilized.

Moreover, where the frequency divider 54 for dividing the output frequency of the voltage-control oscillator 14 is provided at a stage preceding the pulse-generation circuit 55 as shown in FIG. 15, a duration tad of a free choice can be obtained such that the duration tad is not dependent on the frequency-division ratio of the frequency divider 15 used as part of the PLL circuit of the fractional-N-frequency synthesizer. The frequency divider 54 may be of a variable frequency-division-ratio type so as to allow a frequency-division ratio thereof to be changed. In such a case, the duration tad can be set in a variable manner to a period proportional to the output cycle of the voltage-control oscillator 14.

Further, a frequency multiplying unit may be provided in place of the frequency divider 54, such that the frequency multiplying unit receives the output frequency of the voltage-control oscillator 14, and multiplies this frequency by a certain integer. In this case, the duration tad which is proportional to the output cycle of the voltage-control oscillator 14 can be set to a period shorter than the cycle of the output frequency fo.

Further, the present invention is not limited to these embodiments, but various variations and modifications may be made without departing from the scope of the present invention.

What is claimed is:

1. A device for suppressing spurious signals generated by a fractional-N synthesizer which generates an output frequency where an underlying PLL circuit uses a frequency divider for dividing said output frequency by a frequency-division ratio to obtain a comparison frequency and performs phase-comparison operations between a reference frequency and said comparison to control said output frequency, said output frequency being changed by a frequency interval smaller than said reference frequency by making a temporal change to said frequency-division ratio once in every predetermined number of cycles, said device comprising:

a current-generation unit which generates an electrical current proportional to a value representing an ordinal position of a current cycle in said every predetermined number of cycles;

a current-summation unit which adds said electrical current to another electrical current controlling said output frequency in synchronism with said phase-comparison operations for a duration proportional to a cycle of said output frequency;

a pulse-generation unit which generates pulses each having a pulse width proportional to said cycle of said output frequency in synchronism with said phase-comparison operations; and a duration-adjustment unit which adjusts a timing and a duration as to when and how long said electrical current is added to said another electrical current based on said pulses.

2. The device as claimed in claim 1, wherein said current-summation unit receives a signal having a cycle proportional to said cycle of said output frequency from one of internal signal lines of said frequency divider, and determines said duration based on said signal.

3. The device as claimed in claim 2, further comprising a selection switching unit which selects one of said internal signal lines of said frequency divider so as to supply a signal of the selected one of said internal signal lines to said current-summation unit.

4. The device as claimed in claim 1, wherein said current-summation unit receives said comparison frequency from said frequency divider, and determines said duration based on said comparison frequency.

5. The device as claimed in claim 1, wherein said current-summation unit receives said output frequency, and determines said duration based on said output frequency.

6. The device as claimed in claim 5, wherein said current-summation unit includes a frequency divider to divide said output frequency, and determines said duration based on a divided frequency of said output frequency.

7. The device as claimed in claim 6, wherein said frequency divider of said current-summation unit is capable of changing a frequency-division ratio thereof.

8. The device as claimed in claim 5, wherein said current-summation unit includes a frequency multiplying unit to multiply said output frequency by an integer, and determines said duration based on an output of said frequency multiplying unit.

9. A fractional-N synthesizer comprising the device for suppressing spurious signals as claimed in any one of claims 1 and 2 through 8.

10. A device for suppressing spurious signals generated by a fractional-N synthesizer which includes a phase comparator for detecting a phase difference between two signals, a charge-pump circuit for outputting an electric current varying in accordance with said phase difference detected by said phase comparator, a loop filter for converting said electric current to a voltage, an oscillator for outputting a frequency based on said voltage, a frequency divider for dividing said frequency by a frequency-division ratio to supply a resulting signal to said phase comparator as one of said two signals, and a frequency-division-ratio switching circuit for holding a value that changes by a constant step in synchronism with phase-comparison operations of said phase comparator so that said value causes one of overflow and underflow once in a predetermined period and for switching said frequency-division ratio of said frequency divider to another frequency-division ratio only when one of said overflow and said underflow is detected, said device comprising:

a current-generation unit which generates an electric current proportional to said value of said frequency-division-ratio switching circuit;

a current-summation unit which adds said electric current of said current-generation unit to said electric current of said charge-pump circuit in synchronism with said phase-comparison operations of said phase comparator for a duration proportional to a cycle of said frequency of said oscillator;

a pulse-generation unit which generates pulses each having a pulse width proportional to said cycle of said output frequency in synchronism with said phase-comparison operations; and a duration-adjustment unit which adjusts a timing and a duration as to when and how long said electrical current is added to said another electrical current based on said pulses.

11. A fractional-N synthesizer comprising:

a phase comparator for detecting a phase difference between two signals;

a charge-pump circuit for outputting an electric current varying in accordance with said phase difference detected by said phase comparator;

a loop filter for converting said electric current to a voltage;

a frequency divider for dividing said frequency by a frequency-division ratio to supply a resulting signal to said phase comparator as one of said two signals;

a frequency-division-ratio switching circuit for holding a value that changes by a constant step in synchronism with phase-comparison operations of said phase comparator so that said value causes one of overflow and underflow once in a predetermined period and for switching said frequency-division ratio of said frequency divider to another frequency-division ratio only when one of said overflow and said underflow is detected;

a current-generation unit which generates an electric current proportional to said value of said frequency-division ratio switching circuit;

a current-summation unit which adds said electric current of said current-generation unit to said electric current of said charge-pump circuit in synchronism with said phase-comparison operations of said phase comparator for a duration proportional to a cycle of said frequency of said oscillator;

a pulse-generation unit which generates pulses each having a pulse width proportional to said cycle of said output frequency in synchronism with said phase-comparison operations; and a duration-adjustment unit which adjusts a timing and a duration as to when and how long said electrical current is added to said another electrical current based on said pulses.

12. A method of suppressing spurious signals generated by a fractional-N synthesizer which includes a phase comparator for detecting a phase difference between two signals, a charge-pump circuit for outputting an electrical current varying in accordance with said phase difference detected by said phase comparator, a loop filter for converting said electrical current to a voltage, an oscillator for outputting a frequency based on said voltage, a frequency divider for dividing said frequency by a frequency-division ratio to supply a resulting signal to said phase comparator as one of said two signals, and a frequency-division-ratio switching circuit for holding a value that changes by a constant step in synchronism with phase-comparison operations of said phase comparator so that said value causes one of overflow and underflow once in a predetermined period and for switching said frequency-division ratio of said frequency divider to another frequency-division ratio only when one of said overflow and said underflow is detected, said method comprising the steps of:

a) generating an electrical current proportional to said value of said frequency-division-ratio switching circuit;

b) adding said electrical current of said step a) to said electric current of said charge-pump circuit in synchronism with said phase-comparison operations of said phase comparator; and c) adjusting a duration of said adding of said step b) to be proportional to a cycle of said frequency of said oscillator.

\* \* \* \* \*